US011527667B2

(12) United States Patent
Jain et al.

(10) Patent No.: US 11,527,667 B2
(45) Date of Patent: Dec. 13, 2022

(54) TUNNEL JUNCTIONS FOR MULTIJUNCTION SOLAR CELLS

(71) Applicants: Alliance for Sustainable Energy, LLC, Golden, CO (US); THE REGENTS OF THE UNIVERSITY OF CALIFORNIA, A CALIFORNIA CORPORATION, Oakland, CA (US)

(72) Inventors: Nikhil Jain, Sunnyvale, CA (US); Myles Aaron Steiner, Denver, CO (US); John Franz Geisz, Wheat Ridge, CO (US); Emmett Edward Perl, Boulder, CO (US); Ryan Matthew France, Golden, CO (US)

(73) Assignees: Alliance for Sustainable Energy, LLC, Golden, CO (US); The Regents of the University of California, A California Corporation, Oakland, CA (US)

( * ) Notice: Subject to any disclaimer, the term of this patent is extended or adjusted under 35 U.S.C. 154(b) by 95 days.

(21) Appl. No.: 15/964,852

(22) Filed: Apr. 27, 2018

(65) Prior Publication Data

US 2018/0315879 A1 Nov. 1, 2018

Related U.S. Application Data

(60) Provisional application No. 62/491,061, filed on Apr. 27, 2017.

(51) Int. Cl.
*H01L 31/0725* (2012.01)
*H01L 31/036* (2006.01)
(Continued)

(52) U.S. Cl.
CPC ........ *H01L 31/0725* (2013.01); *H01L 31/036* (2013.01); *H01L 31/035209* (2013.01);
(Continued)

(58) Field of Classification Search
CPC ............. H01L 31/0725; H01L 31/0687; H01L 31/0693; H01L 31/0735; H01L 31/035209; H01L 31/035236
See application file for complete search history.

(56) References Cited

U.S. PATENT DOCUMENTS

| 6,316,715 B1 * | 11/2001 | King | ................... H01L 31/0304 136/249 |
| 6,967,345 B1 * | 11/2005 | Gunapala | ............... B82Y 20/00 257/14 |
| 2013/0263923 A1 | 10/2013 | Jones-Albertus et al. | |

OTHER PUBLICATIONS

Bedair et al. "High performance as-grown and annealed high band gap tunnel junctions: Te behavior at the interface." Appl. Phys. Lett. 108, 203903 (May 19, 2016); https://doi.org/10.1063/1.4951690 (Year: 2016).*

(Continued)

*Primary Examiner* — Shannon M Gardner
(74) *Attorney, Agent, or Firm* — Neal Vickery

(57) ABSTRACT

Tunnel junctions for multijunction solar cells are provided. According to an aspect of the invention, a tunnel junction includes a first layer including p-type AlGaAs, a second layer including n-type GaAs, wherein the second layer is a quantum well, and a third layer including n-type AlGaAs or n-type lattice matched AlGaInP. The quantum well can be GaAs or AlxGaAs with x being more than about 40%, and lattice matched GaInAsNSb in the Eg range of from about 0.8 to about 1.4 eV.

6 Claims, 9 Drawing Sheets

(51) Int. Cl.
*H01L 31/0352* (2006.01)
*H01L 31/0735* (2012.01)
*H01L 31/0687* (2012.01)
*H01L 31/0693* (2012.01)

(52) U.S. Cl.
CPC ...... *H01L 31/0687* (2013.01); *H01L 31/0693* (2013.01); *H01L 31/0735* (2013.01); *Y02E 10/544* (2013.01)

(56) References Cited

OTHER PUBLICATIONS

Dimroth, F. et al., "Wafer bonded four-junction GaInP/GaAs// GaInAsP/GaInAs concentrator solar cells with 44.7% efficiency," Progress in Photovoltaics: Research and Applications, vol. 22, 2014, pp. 277-282.

France, R. et al., "Design Flexibility of Ultrahigh Efficiency Four-Junction Inverted Metamorphic Solar Cells," IEEE Journal of Photovoltaics, vol. 6, No. 2, Mar. 2016, pp. 578-583.

Garcia, I. et al., "Performance analysis of AlGaAs/GaAs tunnel junctions for ultra-high concentration photovoltaics," Journal of Physics D: Applied Physics, vol. 45, 2012, 8 pages.

Garcia, I. et al., "Spectral binning for energy production calculations and multijunction solar cell design," Wiley Progress in Photovoltaics, Research Article, vol. 26, pp. 48-54.

Geisz, J. et al., "Enhanced external radiative efficiency for 20.8% efficient single-junction GaInP solar cells," Applied Physics Letters, vol. 103, 2013, 5 pages.

Geisz, J. et al., "Generalized Optoelectronic Model of Series-Connected Multijunction Solar Cells," IEEE Journal of Photovoltaics, vol. 5, No. 6, 2015, pp. 1827-1839.

Geisz, J. et al., "Pathway to 50% Efficient Inverted Metamorphic Concentrator Solar Cells," AIP 13th International Conference on Concentrator Photovoltaic Systems (CPV-13), May 2017, 6 pages.

Geisz, J. et al., "Building a Six Junction Inverted Metamorphic Concentrator Solar Cell," IEEE Journal of Photovoltaics, vol. 8, No. 2, Mar. 2018.

Jain, N. et al., "Enhanced Current Collection in 1.7 eV GaInAsP Solar Cells Grown on GaAs by Metalorganic Vapor Phase Epitaxy," IEEE Journal of Photovoltaics, vol. 7, No. 3, May 2017, pp. 927-933.

Lumb, M. et al., "Double quantum-well tunnel junctions with high peak tunnel currents and low absorption for InP multi-junction solar cells," Applied Physics Letters, vol. 100, 2012, pp. 213907-1 through 213907-4.

McMahon, W. et al., "Multijunction solar cell design revisited: disruption of current matching by atmospheric absorption bands," Progress in Photovoltaics: Research and Applications, vol. 25, 2017, pp. 850-860.

Oshima, R. et al., "Growth of lattice-matched GaInAsP grown on vicinal GaAs(001) substrates within the miscibility gap for solar cells," Journal of Crystal Growth, vol. 458, 2017, pp. 1-7.

Perl, E. et al., "Development of High-Bandgap AlGaInP Solar Cells Grown by Organometallic Vapor-Phase Epitaxy," IEEE Journal of Photovoltaics, vol. 6, No. 3, 2016, pp. 770-776.

Schulte, K. et al., "Highly Transparent Compositionally Graded Buffers for New Metamorphic Multijunction Solar Cell Designs," IEEE Journal of Photovoltaics, vol. 7, No. 1, Jan. 2017, pp. 347-353.

Steiner, M. et al., "Optical enhancement of the open-circuit voltage in high quality GaAs solar cells," Journal of Applied Physics, vol. 113, 2013, pp. 123109-1 through 123109-11.

* cited by examiner

TUNNEL JUNCTIONS FOR MULTIJUNCTION SOLAR CELLS

CROSS-REFERENCE TO RELATED APPLICATION

This application claims priority from U.S. Provisional Application No. 62/491,061, filed Apr. 27, 2017, the disclosure of which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

A multijunction solar cell includes more than one p-n junction, each of which produces electric current upon absorbing different wavelengths of light. III-V compound semiconductor-based multijunction solar cells offer the highest solar energy to electricity conversion efficiency to date. The current world record of greater than 46% conversion efficiency under concentrated sunlight has been demonstrated with multijunction solar cells including four subcells (or four p-n junctions).

Monolithic multijunction solar cells include series-connected individual solar cell layers, which are sequentially deposited on top of each other. Each subcell in a multijunction solar cell is connected to the adjacent subcell via a tunnel junction (or Esaki diode). For optimal performance these tunnel junctions should offer key performance characteristics including: (i) high transparency to minimize light absorption in the tunnel junction and allow maximum light penetration to the subcell beneath, (ii) peak tunneling current density should exceed the current density of the multijunction solar cell under high intensity sun concentration (typically >1000× or 15 A/cm$^2$), and (iii) very low differential resistance to minimize any voltage drop across the tunnel junction.

Tunnel junction designs that can simultaneously offer high optical transparency and high peak tunneling current density have been very challenging to obtain. This is due to the fact that the tunneling probability decreases while the optical transparency increases with an increase in the semiconductor bandgap. Optimizing these competing performance characteristics becomes even more challenging under concentrated photovoltaic (CPV) operations, where peak tunneling current density exceeding well over 15 A/cm$^2$ are sought.

SUMMARY

Exemplary embodiments of the invention provide tunnel junctions that are used in multijunction solar cells.

In an aspect, a tunnel junction is disclosed that comprises, in order, a first layer comprising p-type AlGaAs, a second layer comprising n-type GaAs, wherein the second layer is a quantum well; and a third layer comprising n-type AlGaAs. In an embodiment, the tunnel junction has a concentration of Al in the first layer that is at least 40%. In an embodiment, the tunnel junction has a concentration of Al in the first layer that is at least 50%. In an embodiment, the tunnel junction has a concentration of Al in the first layer that is at least 60%. In an embodiment, the tunnel junction has a concentration of Al in the third layer that is at least 40%. In an embodiment, the tunnel junction has a concentration of Al in the third layer that is at least 50%. In an embodiment, the tunnel junction has additional adjacent layers selected from the group consisting of AlInGaP, AlGaAs, GaAs, GaInP, GaInAsP, InGaAsSb, InGaAsNSb, InP, InGaAs, InAlAs, GaAsSb, AlAsSb, GaInAsSb, and GaInAsP. In another embodiment, the tunnel junction has a second layer and a third layer that are doped with Se, Si, Te or any combination thereof at a concentration of from about $1\times10^{18}$ cm$^{-3}$ to about $1\times10^{20}$ cm$^{-3}$. In yet another embodiment, the tunnel junction has a second layer quantum well that is selected from the group consisting of Al$_x$GaAs, or GaInAsNSb wherein x is at less than 40%. In an embodiment, the tunnel junction has a thickness of the second layer from about 1 nm to about 20 nm. In an embodiment, the tunnel junction has a thickness of the second layer less than about 12 nm.

In an aspect, a multijunction solar cell is disclosed that comprises, a miscut substrate comprising GaAs, at least one tunnel junction comprising a first layer comprising p-type AlGaAs, a second layer comprising n-type GaAs, wherein the second layer is a quantum well, and a third layer comprising n-type AlGaAs. In an embodiment, the substrate comprising GaAs is miscut toward the A plane by about 0 to about 15 degrees. In an embodiment, the substrate comprising GaAs is miscut toward the B plane by about 0 to about 15 degrees. In an embodiment, the substrate comprising GaAs is miscut toward the AB plane by about 0 to about 15 degrees. In another embodiment, the multijunction solar cell has a third layer that is lattice-matched Al$_x$Ga$_1$-xInP to GaAs wherein In is 0.50 and x is from zero to one. In an embodiment, the tunnel junction has a concentration of Al in the first layer that is at least 40%. In an embodiment, the tunnel junction has a concentration of Al in the first layer that is at least 50%. In an embodiment, the tunnel junction has a concentration of Al in the first layer that is at least 60%. In an embodiment, the multijunction solar cell has at least one tunnel junction that has a concentration of Al in the third layer that is at least 40%. In an embodiment, the multijunction solar cell has at least one the tunnel junction has a concentration of Al in the third layer that is at least 50%. In an embodiment, the multijunction solar cell has at least one tunnel junction that has additional adjacent layers selected from the group consisting of AlInGaP, AlGaAs, GaAs, GaInP, GaInAsP, InGaAsSb, InGaAsNSb, InP, InGaAs, InAlAs, GaAsSb, AlAsSb, GaInAsSb, and GaInAsP. In another embodiment, the multijunction solar cell has at least one tunnel junction that has a second layer and a third layer that are doped with Se, Si, Te or any combination thereof at a concentration of from about $1\times10^{18}$ cm$^{-3}$ to about $1\times10^{20}$ cm$^{-3}$. In yet another embodiment, the multijunction solar cell has at least one tunnel junction that has a second layer quantum well that is selected from the group consisting of Al$_x$GaAs, or GaInAsNSb wherein x is at less than 40%. In an embodiment, the tunnel junction has a thickness of the second layer from about 1 nm to about 20 nm. In an embodiment, the tunnel junction has a thickness of the second layer less than about 12 nm.

Other objects, advantages, and novel features of the present invention will become apparent from the following detailed description of the invention when considered in conjunction with the accompanying drawings.

BRIEF DESCRIPTION OF THE DRAWINGS

FIG. 3 depicts the effect of varying the Aluminum concentration on current density in a multijunction cell having a 12 nm thick n-GaAs QW doped with carbon at about 7×10" cm$^{-3}$ and having 30% AlGaAs on the n-side according to exemplary embodiments of the invention. As depicted, tunneling probability decreases beyond about 60% Aluminum concentration in p-Al$_x$Ga$_{1-x}$As.

DETAILED DESCRIPTION

The present invention relates to tunnel junctions for multijunction solar cells. In particular, the tunnel junctions may be highly transparent, and may be used in III-V compound semiconductor-based multijunction solar cells.

Figure 1:
FIG. 1 depicts the structure of a tunnel junction according to an exemplary embodiment of the invention.
Figure 2B:
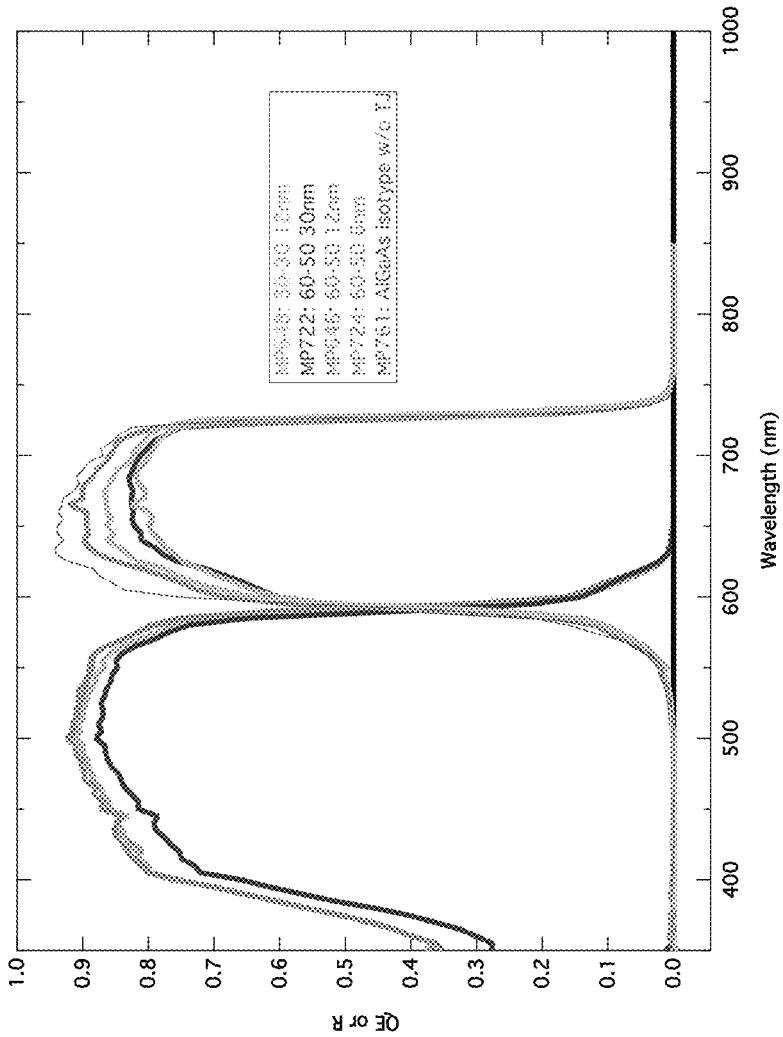
FIG. 2B depicts the quantum efficiency (QE) of multijunction cells according to exemplary embodiments of the invention as a function of wavelength.
Figure 2A:
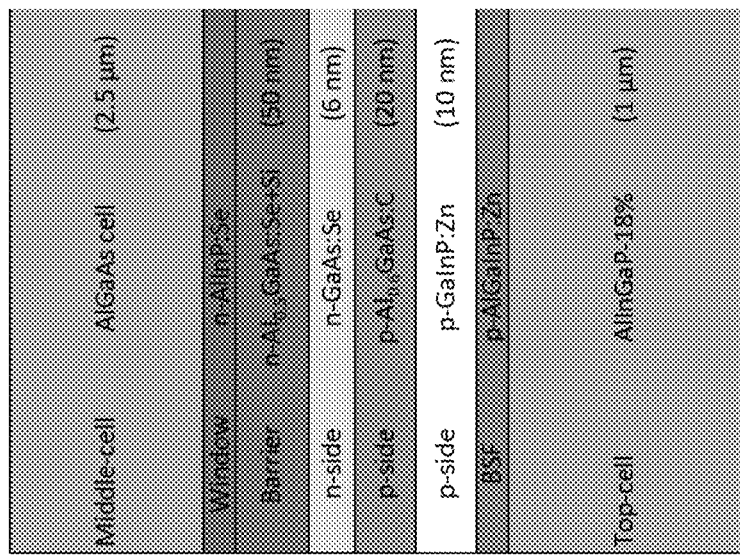
FIG. 2A depicts a multijunction cell containing a tunnel junction according to an exemplary embodiment of the invention.
Figure 3:
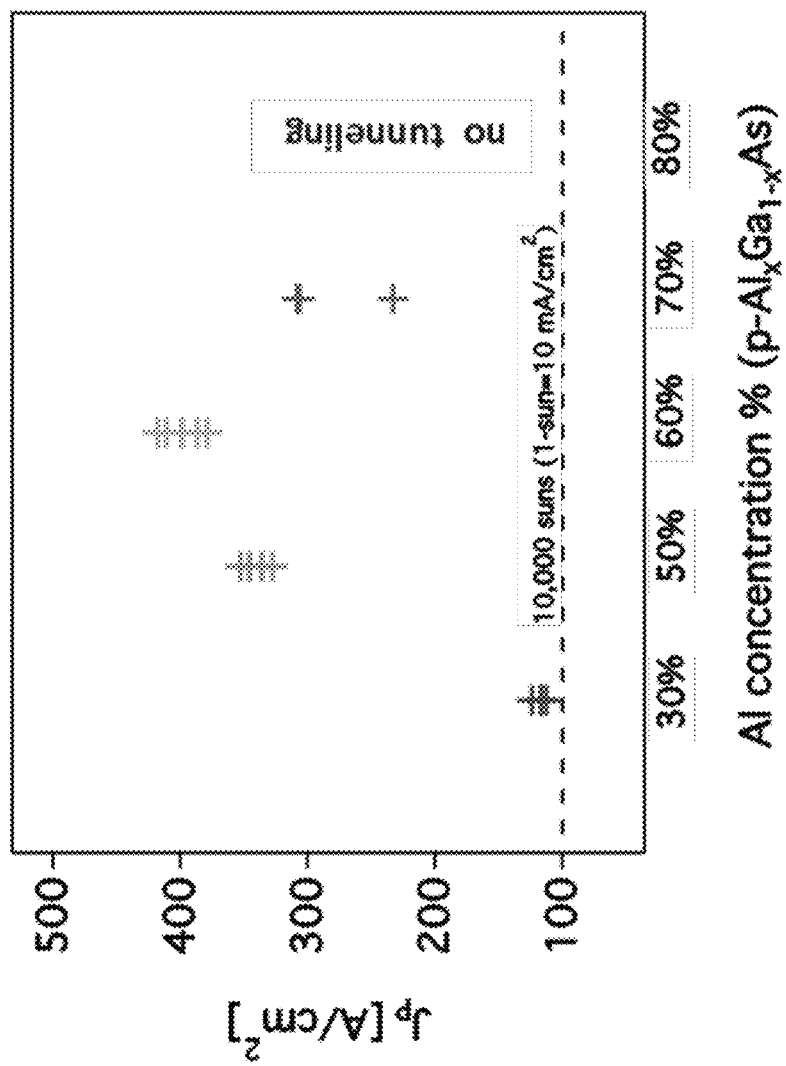
Figure 4:
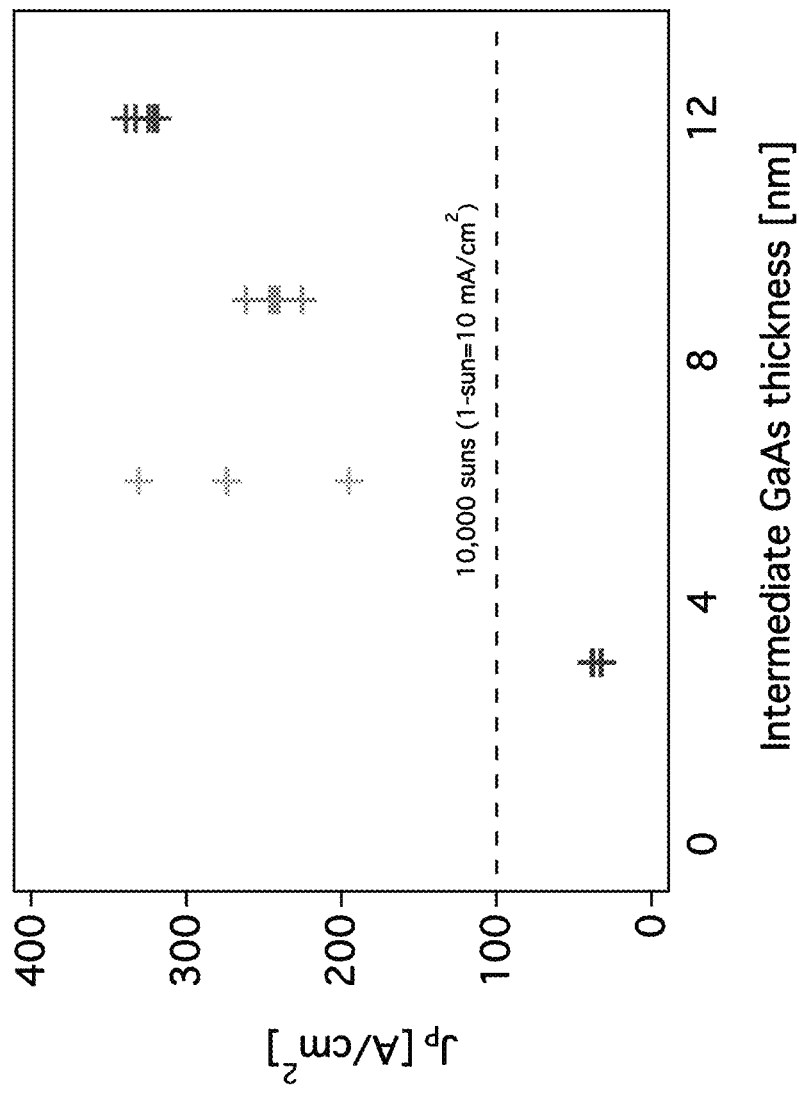
FIG. 4 depicts the effect of varying GaAs QW n-type thickness where there is a 60% concentration of Aluminum on the p-side and a 50% concentration of Aluminum on the n-side according to exemplary embodiments of the invention. As depicted, the AlGaAs n-side barrier plays a role in the overall tunneling process with the farther that the layer is from the tunnel junction, the better the overall tunnel diode, for example.
Figure 5:
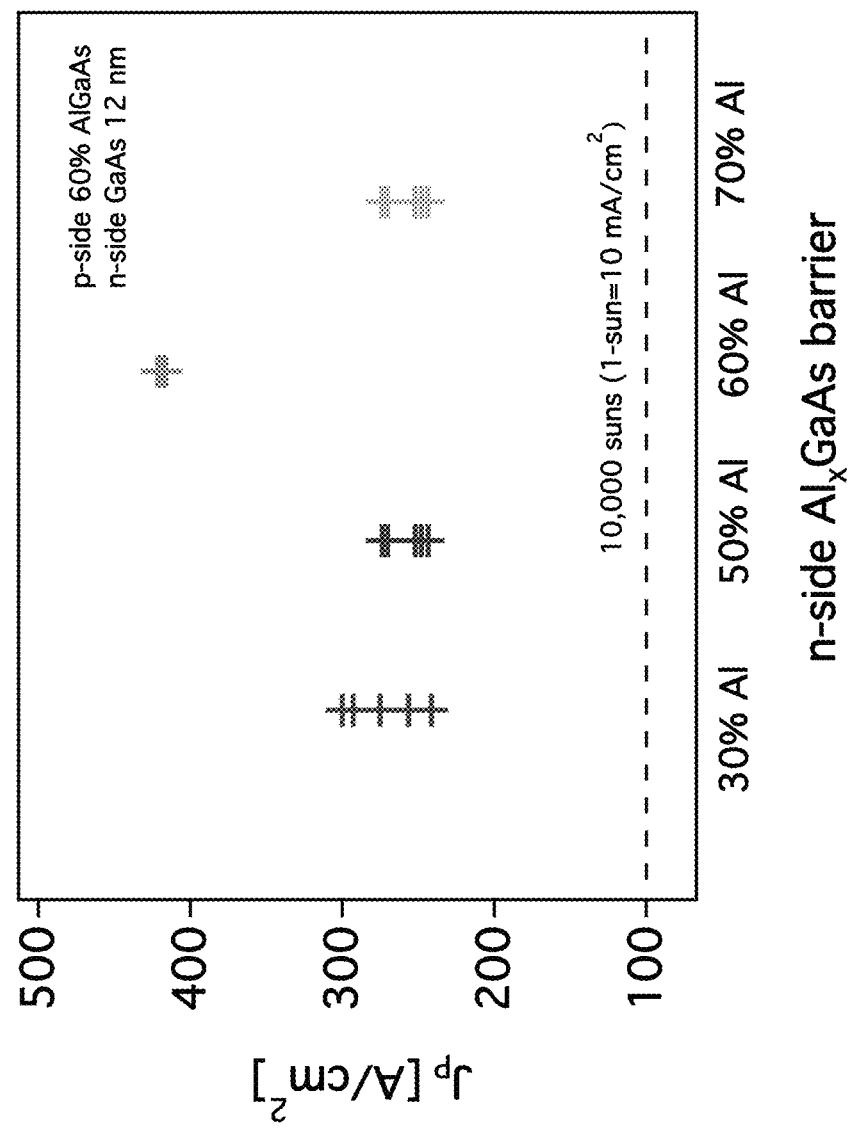
FIG. 5 depicts the effect of varying Aluminum concentration on the n-side barrier of a tunnel junction having a 12 nm thick n-GaAs QW doped with carbon at about 7×10" cm$^{-3}$ and having a 60% AlGaAs:C on the p-side.
Figure 6:
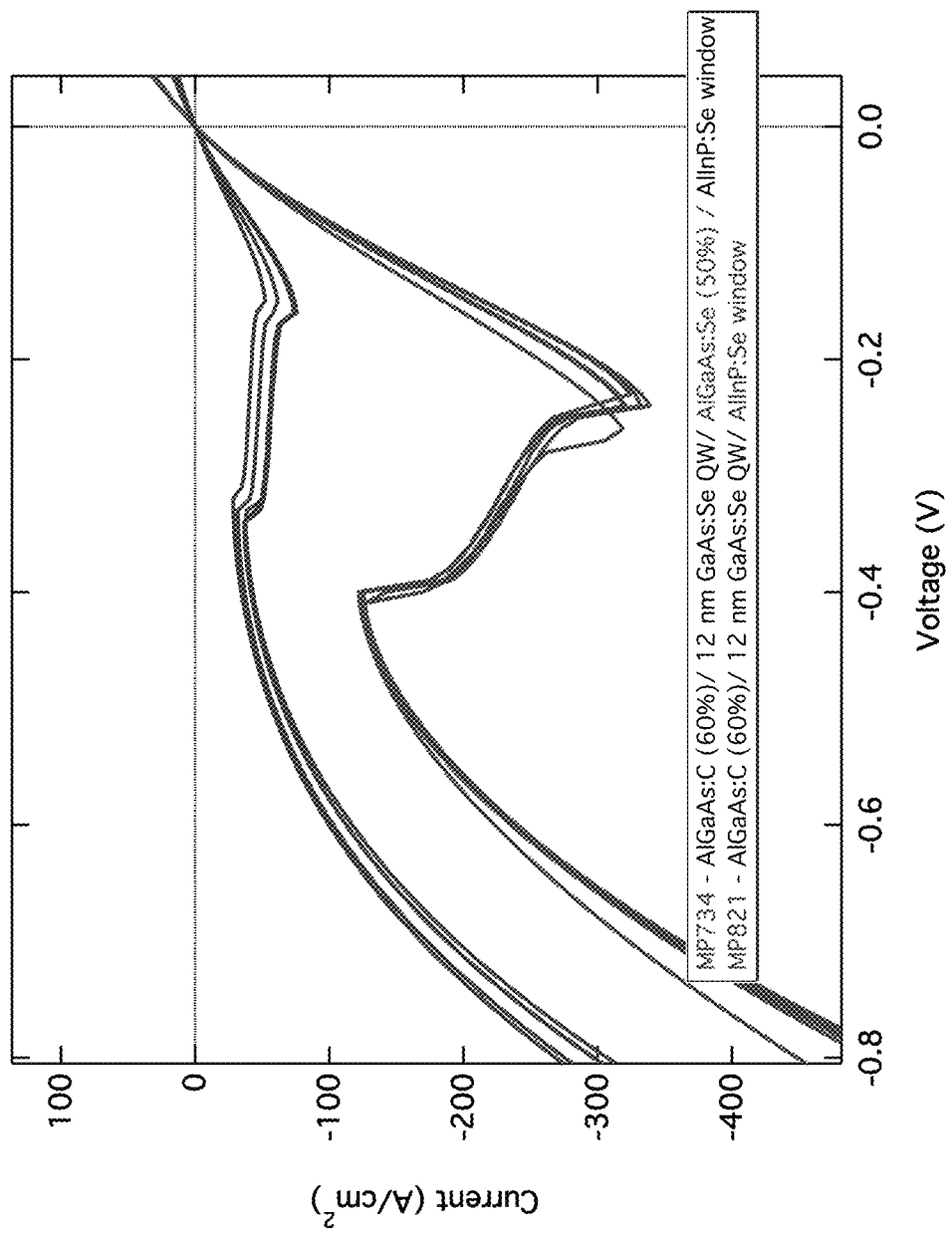
FIG. 6 depicts the effect of the AlGaAs barrier on current density versus voltage of a cell having 12 nm thick n-GaAs QW doped with carbon at about 7×10" cm$^{-3}$ and having a 60% AlGaAs:C on the p-side with a AlGaAs barrier and of a cell that does not have a AlGaAs barrier. As depicted, the AlGaAs barrier contributes to the overall tunneling process.
Figure 7B:
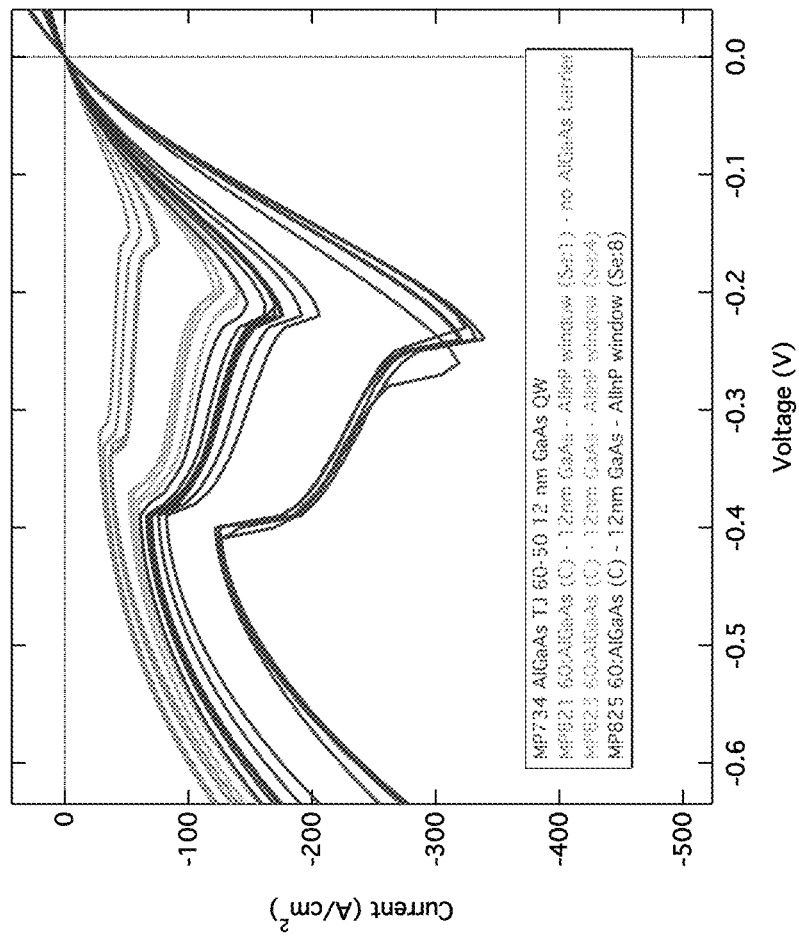
FIG. 7B depicts current density versus voltage of various multijunction cells containing an AlInP based tunneling junction according to an exemplary embodiment of the invention and having 12 nm thick n-GaAs QW doped with carbon at about 7×10" cm$^{-3}$ and having a 60% AlGaAs:C on the p-side.
Figure 7A:
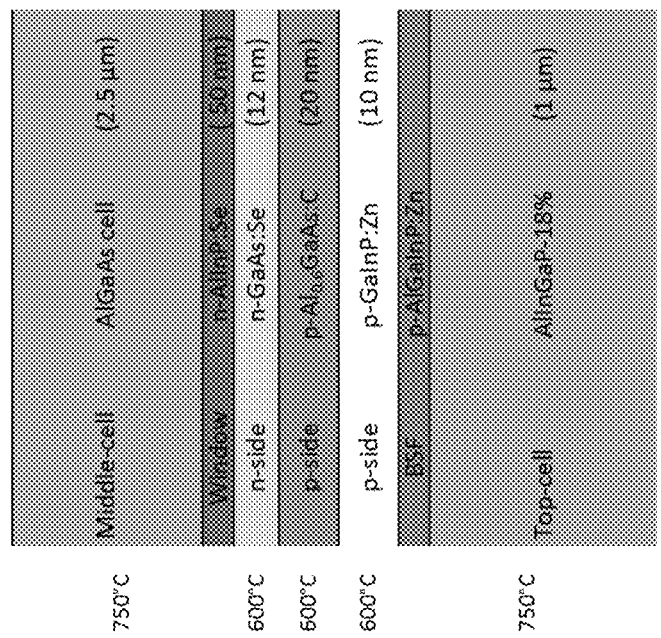
FIG. 7A depicts a multijunction cell containing tunneling junctions according to an exemplary embodiment of the invention where the middle cell and top cell were grown at 750° C. The morphology of AlInP is improved when grown at 750° C. as compared to 600° C.
Figure 8:
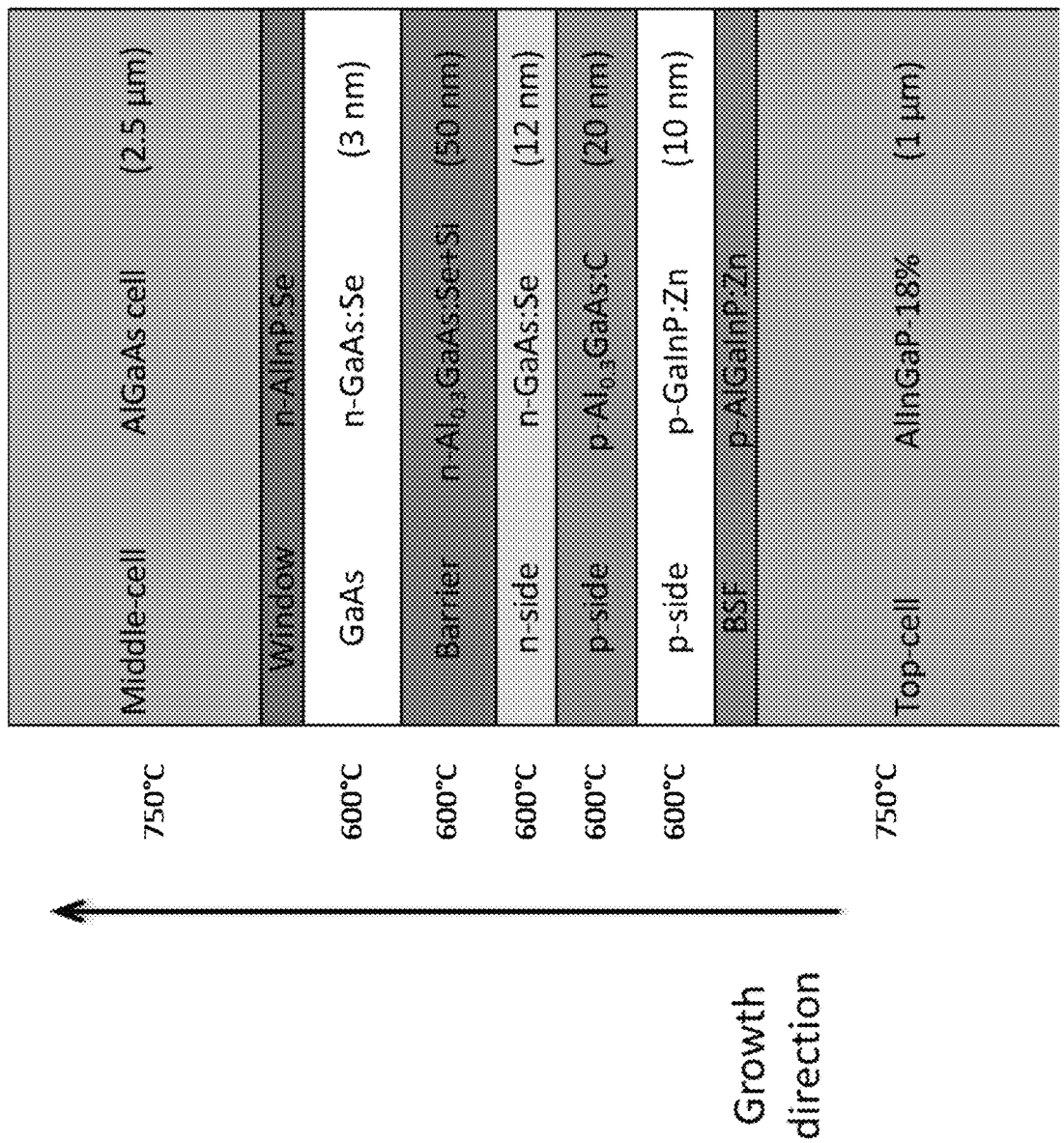
FIG. 8 depicts another embodiment of a multijunction cell containing a transparent tunneling junctions according to an exemplary embodiment of the invention where the middle cell and top cell were grown at 750° C.

FIG. 1 depicts the structure of a tunnel junction according to an exemplary embodiment of the invention. The tunnel junction is a quantum-well tunnel junction (QWTJ) diode that is nearly transparent to incident solar energy in the full solar spectrum and with sufficient peak tunneling current density to allow operation at up to and over 1000× sun concentration. These tunnel diodes include heavily doped alternating high bandgap p-type and n-type cladding layers (AlGaAs with >40% Al) with a thin (<12 nm) sandwiched n-type GaAs quantum-well layer. Historically, AlGaAs-based n-side layers have been avoided in tunnel junctions due to the difficulty in achieving high n-type doping (high bandgap) and due to the formation of deep level recombination centers.

Exemplary embodiments of the present invention provide tunnel junctions having several features. For example, the quantum-well (QW) design allows for high peak-tunneling current without the need for very high degenerate doping (>1×10$^{19}$ cm$^{-3}$) in the n-type (Al)GaAs layer, which is even a bigger challenge on A-miscut substrates. Also, unlike related art GaInP-based (p-AlGaAs/GaAs/n-GaInP) tunnel junctions, the p-AlGaAs/n-GaAs/n-AlGaAs structure depicted in FIG. 1 offers better transparency in comparison to direct bandgap GaInP layers. It is noted that AlGaAs with >40% Al becomes an indirect bandgap semiconductor.

In an embodiment, transparent tunneling junctions disclosed herein are more transparent than GaInP based tunneling junctions. In another embodiment, transparent tunneling junctions disclosed herein allow for higher current density without the necessity of degenerate n-doping. In an embodiment, multijunction cells having tunneling junctions disclosed herein can tolerate thermal loads with growth temperatures up to and in excess of 750° C.

Further, the AlGaAs/GaAs/AlGaAs QWTJ in accordance with exemplary embodiments of the invention offers easier composition tunability in comparison to related art AlGaAs/GaAs/GaInP based QWTJs, which require more complex As—P hetero-interface switching besides lattice-matching constraints. In addition, the structure depicted in FIG. 1 allows tunnel junction operation with only a single QW, unlike multiple QW-based designs in related art. Although the QW depicted in FIG. 1 is made of GaAs, the QW could be made of any suitable material, such as InAs. In another embodiment, the QW is GaAs or AlGaAs where x is less than 40%. In yet another embodiment, the QW is lattice matched GaInAsNSb in the Eg range of from about 0.8 to about 1.4 eV.

Without being bound by theory, because exemplary embodiments of the invention use lattice-matched alloys, a strain balanced QWTJ design is not necessary in some embodiments. Further, the structure shown in FIG. 1 could be extended to other alloy families on GaAs (AlInGaP, AlGaAs, GaAs, GaInP, GaInAsP, InGaAsSb, InGaAsNSb, etc.) and InP (InGaAs, InAlAs, GaAsSb, AlAsSb, GaInAsSb, GaInAsP, etc.) Although the present QWTJ is designed for inverted multijunction solar cells, the design could also be applied to upright-grown multijunction solar cells.

Most reports on related art tunnel junction diodes are for standalone test structures, and usually only show one-sun operation. Exemplary embodiments of the present invention show operation up to and over 1000× sun, and these tunnel junctions appear to tolerate a thermal budget of 3-junction solar cells with growth temperatures reaching 750° C.

In an embodiment, a p-type AlGaAs layer is carbon doped in the range of from 1×10$^{18}$ to 1×10$^{20}$ cm$^{-3}$. In another embodiment, a QW layer is n-doped with Se. In an embodiment, a n-side layer (AlGaAs or AlGaInP) is n-doped with Si, or Se, or Te or a combination thereof.

In another embodiment, a QW is GaAs, Al$_x$GaAs, or GaInAsNSb where x is less than 40%.

In an embodiment, the layers of the TJ are lattice-matched within about 0.2% misfit.

In another embodiment, the thickness of the barrier layers is between about 10 to about 60 nm.

In an embodiment, the TJ can be used under any solar spectrum including AM 0, AM 1.5 g, and AM 1.5 d. In another embodiment, the TJ structure can be used under any concentration of sunlight.

In an embodiment, the TJ structure can be grown in either the n-side first or p-side first direction.

Embodiments of the TJ structure disclosed herein can be used in other optoelectronic devices such as LEDs and lasers, for example.

In an embodiment, the substrate is miscut toward the A plane by 0 to about 15 degrees. In an embodiment, the substrate is miscut toward the B plane by 0 to about 15 degrees. In an embodiment, the substrate is miscut toward the AB plane by 0 to about 15 degrees.

Figures 9A, 9B:
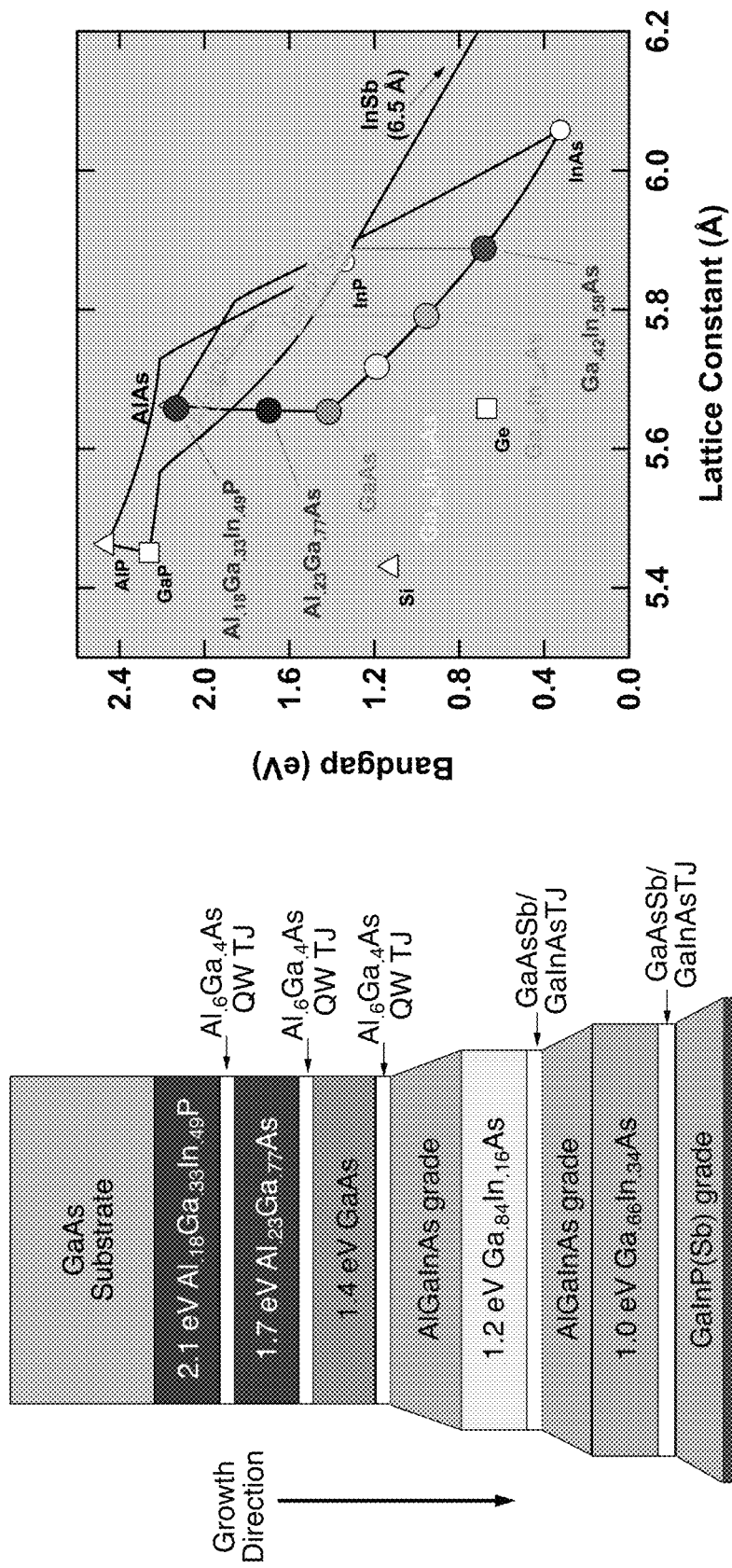
FIG. 9A is a schematic representation of a six junction inverted metamorphic (IMM) solar cell incorporating QWTJs as disclosed herein.
FIG. 9B is a diagram of bandgaps vs. lattice constants for various layers of the six junction inverted metamorphic solar cell of FIG. 9A.

In an embodiment, multijunction solar cells that incorporate quantum well tunnel junctions are disclosed herein. Six junction IMM solar cells are grown by metal organic vapor phase epitaxy (MOVPE) on (001) GaAs substrates miscut 6° toward the (111) A direction. The 6° A miscut substrates were used primarily to promote disordering to achieve a high bandgap in the top junction. Growth of the structure progresses in an inverted direction as depicted in FIG. 9A. After growth of a GaInP, etch stop and GaInNAs:Se top contact layer, the high-bandgap first "reverse heterojunction" cell composed of a 3% to 6% Al AlGaInP emitter and an 18% Al AlGaAsInP base is grown at 750° C. The lower aluminum content in the emitter allows relatively low emitter sheet resistance. A transparent $Al_{0.6}Ga_{0.4}As$ tunnel junction with a thin GaAs quantum well was included after each of the first three lattice-matched junctions. The 1.7 eV $Al_{0.6}Ga_{0.4}As$ junction was also grown at 750° C., but subsequent junctions are grown at lower temperatures.

Compositionally graded buffers (CGB) sequentially transitioned the lattice constant from 5.655 Å (GaAs) to 5.888 Å (beyond InP) for three $Ga_xIn_{1-x}As$ junctions with bandgaps of 1.16, 0.94, and 0.70 eV as depicted in FIG. 9B. The first two CGB were composed of $Al_xGa_{1-x-y}In_yAs$ with about x=50% Al to maintain transparency and reduce roughness. GaInP was not used for these first two CGBs since it would tend to phase separate on the 6° A substrates. The material stability and dislocation glide dynamics were improved through ordering that was promoted by 2° B miscut substrates. At lattice constants close to InP, phase stability of $Al_xGa_{1-x-y}In_yAs$ becomes problematic, while the $Ga_xIn_{1-x}P$ becomes more stable. Thus, in an embodiment, the third, and final, CGB was composed initially of $Ga_xIn_{1-x}P$ with x=20% to 0%, and then $InP_{1-y}Sb_y$ with y=0% to 3%. In an embodiment, the last two tunnel junctions used were metamorphic tunnel junctions composed of Se-doped GaInAs and C-doped GaAsSb with the same lattice constant as the fourth and fifth $Ga_xIn_{1-x}As$ junctions.

In an embodiment, the IMM devices were processed with front and back electroplated gold contacts, attached to a silicon handle with low-viscosity epoxy. Mesa isolation was accomplished with selective chemical etchants. Concentrator grids where used with finger spacing of 125-350 microns for approximately 0.10 $cm^2$ illuminated area devices. An e-beam evaporated 4-layer $ZnS/MgF_2/ZnS/MgF_2$ antireflective coating was used for relatively broadband performance.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A tunnel junction in a multijunction solar cell comprising, in order:
   a first layer comprising p-type AlGaAs;
   a second layer comprising n-type GaAs, wherein the second layer is a quantum well; and
   a third layer comprising n-type AlGaAs, wherein the concentration of Al in the third layer is at least 50%; and
   wherein the second layer and the third layer are doped with Se, Si, Te or any combination thereof at a concentration of from about $1\times10^{18}$ $cm^{-3}$ to about $1\times10^{20}$ $cm^{-3}$.

2. The tunnel junction of claim 1, wherein a concentration of Al in the first layer is selected from the group consisting of at least 40%, at least 50%, and at least 60%.

3. The tunnel junction of claim 1, further comprising additional adjacent layers selected from the group consisting of AlInGaP, AlGaAs, GaAs, GaInP, GaInAsP, InGaAsSb, InGaAsNSb, InP, InGaAs, InAlAs, GaAsSb, AlAsSb, GaInAsSb, and GaInAsP.

4. The tunnel junction of claim 1, wherein the second layer quantum well is selected from the group consisting of $Al_xGaAs$, or GaInAsNSb wherein x is at less than 40%.

5. The tunnel junction of claim 1, wherein the thickness of the second layer is from about 1 nm to about 20 nm.

6. The tunnel junction of claim 1 that is operable up to about 1000× sun.

* * * * *